(12) United States Patent
Hajimiri et al.

(10) Patent No.: US 7,489,194 B2
(45) Date of Patent: *Feb. 10, 2009

(54) COMMON GATE WITH RESISTIVE FEED-THROUGH LOW NOISE AMPLIFIER

(75) Inventors: Seyed-Ali Hajimiri, Pasadena, CA (US); Xiang Guan, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/633,720

(22) Filed: Dec. 5, 2006

(65) Prior Publication Data

US 2007/0075779 A1    Apr. 5, 2007

Related U.S. Application Data

(63) Continuation of application No. 10/731,832, filed on Dec. 9, 2003, now Pat. No. 7,157,972.

(60) Provisional application No. 60/435,504, filed on Dec. 20, 2002.

(51) Int. Cl.
    *H03F 3/16*    (2006.01)
(52) U.S. Cl. ...................................... 330/277; 330/310
(58) Field of Classification Search ................ 330/133, 330/282, 310, 311, 277, 283
    See application file for complete search history.

(56) References Cited

U.S. PATENT DOCUMENTS 4,001,711 A    1/1977   Knutson et al.
5,172,074 A    12/1992  Shiga
5,361,038 A *  11/1994  Allen et al. ................. 330/277
5,926,069 A    7/1999   Ko et al.
6,278,329 B1   8/2001   Palmisano et al.

(Continued)

FOREIGN PATENT DOCUMENTS

JP    54172531    12/1979

(Continued)

OTHER PUBLICATIONS

International Search Report for PCT/US03/39174, May 5, 2004, 3pgs.

(Continued)

*Primary Examiner*—Khanh V Nguyen
(74) *Attorney, Agent, or Firm*—Jackson Walker L.L.P.; Christopher J. Rourk

(57) ABSTRACT

A radio-frequency amplifier is provided. The radio-frequency amplifier includes a transistor having an input terminal, an output terminal, a control terminal, and a transconductance $g_m$. A series-connected feed-through resistance $R_f$ and feed-through capacitance $C_f$ is connected in parallel with the input terminal and the output terminal of the transistor. A load resistance $R_L$ is connected to the output terminal. The control terminal of the transistor is biased at a fixed voltage. Part of the transistor noise follows the looped path through the feed-through resistor instead of passing on to the load, which reduces the noise figure of the amplifier. The value of $g_m$, $R_f$ and $R_L$ are chosen in a way to keep the input impedance of the amplifier matched to a well-defined signal source impedance.

35 Claims, 6 Drawing Sheets (a)

U.S. PATENT DOCUMENTS

| | | | |
|---|---|---|---|
| 6,366,166 | B1 | 4/2002 | Belot |
| 6,392,490 | B1 * | 5/2002 | Gramegna et al. .......... 330/311 |
| 6,724,253 | B2 * | 4/2004 | Hau et al. .................. 330/277 |
| 6,768,380 | B2 * | 7/2004 | Hong et al. ................ 330/311 |
| 6,806,777 | B2 * | 10/2004 | Franca-Neto ............... 330/311 |

FOREIGN PATENT DOCUMENTS

| | | |
|---|---|---|
| JP | 07204367 | 10/1995 |

OTHER PUBLICATIONS

D.K. Shaeffer et al., A 1.5-V, 1.5-GHz CMOS Low Noise Amplifier, *IEEE Journal of Solid-State Circuits*, IEEE, Inc., May 1997, pp. 745-759, vol. 32, No. 5, New York, N.Y.

H. Darabi et al., "A 4.5-mW 900 MHz CMOS Receiver for Wireless Paging," *IEEE Journal of Solid-State Circuits*, Aug. 2000, pp. 1085-1096, vol. 35. No. 8.

S. Wu et al., "A 900-MHZ/1.8GHz CMOS Receiver for Dual-Band Applications," *IEEE Journal of Solid-State Circuits*, Dec. 1998, pp. 2178-2185, vol. 33, No. 12.

A. Rofougaran et al., "A 1 GHz CMOS RF Front-End IC for a Direct-Conversion Wireless Receiver," *IEEE Journal of Solid-State Circuits*, Jul. 1996, pp. 880-889, vol. 31, No. 7.

J.C. Rudell et al., "A 1.9 GHz Wide-Band IF Double Conversion CMOS Receiver for Cordless Telephone Applications," *IEEE Journal of Solid-State Circuits*, Dec. 1997, pp. 2071-2088, vol. 32, No. 12.

H. Samavati et al., "A 5-GHz CMOS Wireless LAN Receiver Front End," *IEEE Journal of Solid-State Circuits*, May 2000, pp. 765-772, vol. 35, No. 5.

B.A. Floyd et al., A 23.8-GHz SOI CMOS Tuned Amplifier, *IEEE Transactions on Microwave Theory and Techniques*, Sep. 2002, pp. 2193-2196, vol. 50, No. 9.

P. Leroux et al., "A 0.8-dB NF ESD-Protected 9-mW CMOS LNA Operating at 1.23 GHz," *IEEE Journal of Solid-State Circuits*, Jun. 2002, pp. 760-765, vol. 37, No. 6.

S.F. Tin et al., "A Simple Subcircuit Extension of the BSIM3v3 Model for CMOS RF Design," *IEEE Journal of Solid-State Circuits*, Apr. 2000, pp. 612-624, vol. 35, No. 4.

H. Hashemi et al., "Concurrent Multiband Low-Noise Amplifiers—Theory, Design, and Applications," *IEEE Transactions on Microwave Theory and Techniques*, Jan. 2002, pp. 288-301, vol. 50, No. 1.

B.A. Floyd et al., "A 15-GHz Wireless Interconnect Implemented in a 0.18 (µm) CMOS Technology Using Integrated Transmitters, Receivers, and Antennas," *2001 Symposium on VLSI Circuits Digest of Technical Papers*, Jun. 2001, pp. 155-158.

X. Guan et al., "A 24 GHz CMOS Front-End," in *Proc. 28th ESSCIRC*, Sep. 2002, pp. 155-158.

S.M. Alamouti, "A Simple Transmit Diversity Technique for Wireless Communications," *IEEE Journal on Select Areas in Communications*, Oct. 1998, pp. 1451-1458, vol. 16, No. 8.

D. Lu et al., "A 24-GHz Active Patch Array," *International Journal of Infrared and Millimeter Waves*, May 2002, pp. 693-704, vol. 23.

D.K. Shaeffer et al., "A 1.5V, 1.5GHz CMOS Low Noise Amplifier," *1996 Symposium on VLSI Circuits Digest of Technical Papers*, Jun. 1996, pp. 32-33.

R.S. Elliott, "Beamwidth and Directivity of Large Scanning Arrays, First of Two Parts," *Microwave Journal*, Dec. 1963, pp. 53-60.

J.C. Liberti et al., "Smart Antennas for Wireless Communications: IS-95 and Third Generation CDMA Application," 1999, pp. 83-88, Prentice Hall, New Jersey.

Y.C. Ho et al., "3 V Los Noise Amplifier Implemented Using a 0.8 (µm) CMOS Process With Three Metal Layers for 900 MHz Operation," *Electronic Letters*, Jun. 1996, pp. 1191-1193, vol. 32, No. 13.

D.K. Shaeffer et al., "The Design and Implementation of Low-Power CMOS Radio Receivers," 1999, pp. 52-67, Kluwer Academic Publishers, Boston.

Y.C. Ho et al., "Implementation and Improvement for RF Low Noise Amplifiers in Conventional CMOS Technologies," 2000, Ph.D. Thesis, University of Florida, Florida.

A. Van Der Ziel, "Noise in Solid State Devices and Circuits," 1986, pp. 88-91, New York: Wiley.

* cited by examiner (a)

(b)

| Parameters | Overall Front-end | LNA | Mixer |
|---|---|---|---|
| $S_{11}$ | -21 dB | -21 dB | -- |
| $S_{22}$ | -10 dB | -- | -10 dB |
| Peak Frequency | 21.8 GHz RF | 21.8 GHz RF | 4.9 GHz IF |
| Power Gain | 27.5 dB | 15 dB | 13 dB |
| Voltage Gain | 35.7 dB | -- | -- |
| Noise Figure | 7.7 dB | 6 dB | 17.5 dB |
| 1-dB Compression Point | -23 dBm | -- | -- |
| Image Rejection | 31 dB | -- | -- |
| Current Consumption | 43 mA | 16 mA | 4 mA core cell + 23 mA output buffers |
| Supply Voltage | 1.5 V | 1.5 V | 1.5 V |
| Chip Area | 0.4 x 0.5mm$^2$ | 0.2 x 0.25 mm$^2$ | -- |

US 7,489,194 B2

COMMON GATE WITH RESISTIVE FEED-THROUGH LOW NOISE AMPLIFIER

PRIORITY DATA

This application is a continuation application of U.S. patent application Ser. No. 10/731,832, filed Dec. 9, 2003, entitled "Common Gate with Resistive Feed-Through Low Noise Amplifier," which claims priority to U.S. provisional application No. 60/435,504, filed Dec. 20, 2002, entitled "Common Gate with Resistive Feedthrough Low Noise Amplifier," which are incorporated by reference for all purposes.

The U.S. Government has certain rights to this invention pursuant to ONR Grant No. N00014-01-1-0764.

FIELD OF THE INVENTION

The present invention pertains to the field of amplifiers, and in particular to a common gate low noise amplifier with resistive feed-through for improved noise performance.

BACKGROUND OF THE INVENTION

The input stage of the low noise amplifier sets the limits on the sensitivity of the receiver. Therefore, low-noise is one of its most important design goals. Unfortunately, the lower intrinsic gain of transistors at higher frequencies makes it more difficult to achieve a low noise figure at very high frequencies. In such applications, additional noise sources such as gate-induced noise become more prominent with increasing frequency. The low noise amplifier also needs to achieve a sufficient gain to suppress the noise of the following stages and good linearity to handle out-of-band interference while providing a well-defined real impedance, which is normally 50-Ω.

In order to reduce the effect of noise at high frequency, a common-source stage with inductive degeneration has been used in CMOS low noise amplifier ("LNA") implementations. It can be shown that for an input-matched common-source LNA, the minimum achievable noise factor, $F_{min}$, and the effective transconductance, $G_m$, are linearly related to the working frequency, $\omega_0$, and its inverse, $1/\omega_0$, respectively. Although this common-source topology is well suited for applications at operating frequencies in the low GHz range, its performance degrades substantially at higher frequencies when $\omega_0$ becomes comparable to $\omega_T$.

In contrast, in a common-gate (CG) LNA, the gate-source and gate-drain parasitic capacitances of the transistor are absorbed into the LC tank and resonated out at the operating frequency. Therefore, to the first order, the noise and gain performance of the common-gate stage is independent of the operating frequency, which is a desirable feature for high frequency design. However, due to the constraints of input matching, it can be shown that the noise factor of a common-gate LNA has a lower bound of 1+γ for perfect input match, where γ is the channel thermal noise coefficient. This represents a practical limit for noise reduction that restricts high-frequency applications.

SUMMARY OF THE INVENTION

In accordance with the present invention, a common-gate low noise amplifier with resistive feed-through is provided that overcomes known problems with high frequency amplifiers.

In particular, a common-gate low noise amplifier with resistive feed-through is provided that reduces noise effects while maintaining a well-matched input, and that is suitable for applications at either low frequencies or high frequencies.

In accordance with an exemplary embodiment of the present invention, a radio-frequency amplifier is provided. The radio-frequency amplifier includes a transistor having an input terminal, an output terminal, a control terminal, and a transconductance $g_m$. A series-connected feed-through resistance $R_f$ and feed-through capacitance $C_f$ is connected in parallel with the input terminal and the output terminal of the transistor. A load resistance $R_L$ is connected to the output terminal. The control terminal of the transistor is biased at a fixed voltage, such as ac ground. Part of the transistor noise follows the looped path through the feed-through resistor instead of passing on to the load, which reduces the noise figure of the amplifier. In addition, the values of $g_m$, $R_f$ and $R_L$ keep the input impedance of a amplifier matched to a well-defined signal source impedance.

The present invention provides many important technical advantages. One important technical advantage of the present invention is a high-frequency amplifier with improved noise performance that allows radio-frequency signals to be amplified above 20 GHz without the introduction of significant amounts of noise.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
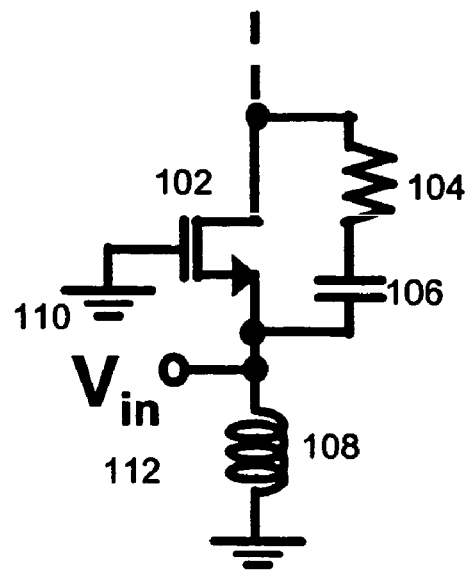
FIG. 1 is a diagram of a common gate LNA with resistive feed-through in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a common gate LNA 100 with resistive feed-through in accordance with an exemplary embodiment of the present invention. Common gate LNA 100 can be implemented in CMOS or in other suitable manners.

Common gate LNA 100 includes transistor 102, which can be a CMOS transistor or other suitable devices. Feed-through resistor 104 is provided in parallel with amplifier 102, and a feed-through capacitance 106 is used to isolate dc level. The gate of transistor 102 is biased at a fixed voltage, and an inductor 108 provides a dc current path from the input terminal to ground.

Feed-through resistor 104 forms a closed loop with the transistor 102 channel thermal noise (or shot noise) source. As such, part of the noise signal follows a looped path through feed-through resistor 104 instead of passing on to the load, which reduces the noise figure of the LNA.

In operation, common gate LNA 100 with feed-through path formed by resistor 104 and capacitance 106 provides for improved performance degradation at higher frequencies. The output noise power due to the transistor channel noise can be lowered towards 0 by reducing resistor 104. The dc current needs to be increased to maintain the gain and input matching. By this means, the topology shown provides a direct way to trade between power dissipation and the noise figure, such that common gate LNA 100 with a feed-through path provides improved performance at very high frequencies where the noise figure takes precedence over power dissipation.

Figure 2:
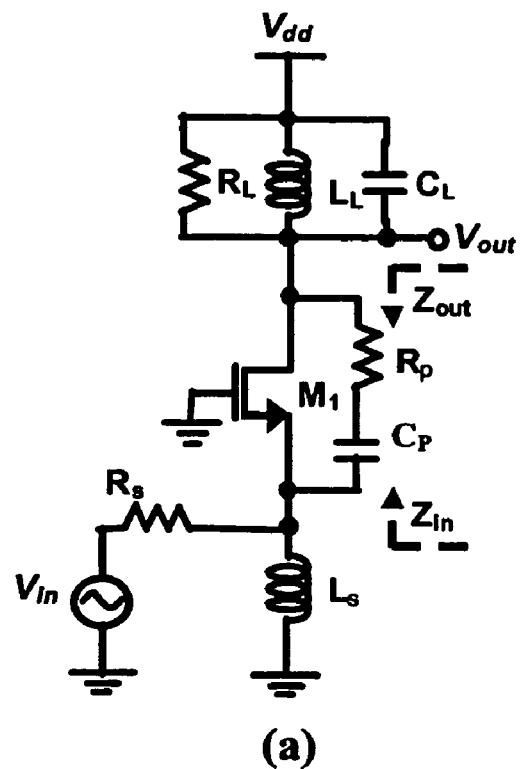
FIG. 2 is a diagram of a common gate LNA with resistive feed-through and a tank circuit in accordance with an exemplary embodiment of the present invention.

FIG. 2 is a diagram of a common gate LNA 200 with resistive feed-through and a tank circuit in accordance with an exemplary embodiment of the present invention. As shown, $R_s$ is the signal source impedance, $C_p$ is a large capacitor for isolating dc level, and $R_L$ is the resistive load at the drain of $M_1$. Inductors $L_L$ and $L_s$ resonate at the operating frequency with a capacitive load at the drain and source of $M_1$, respectively.

Figure 3:
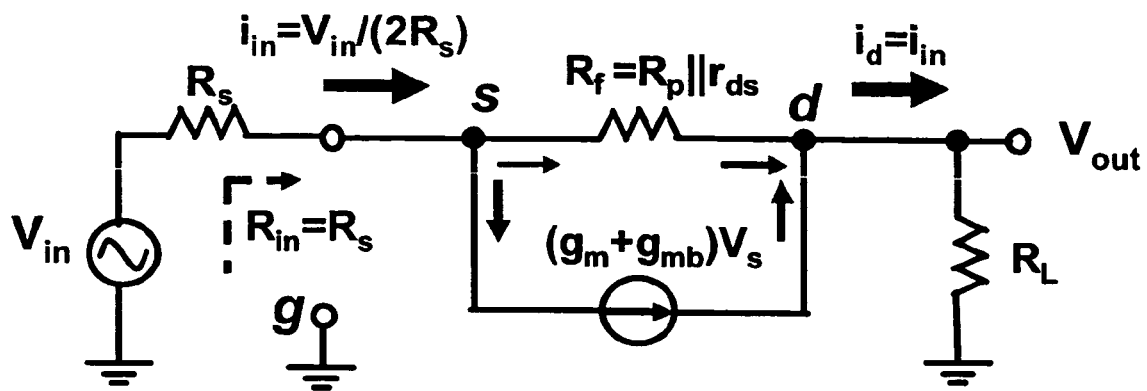
FIG. 3 is a gain analysis circuit in accordance with an exemplary embodiment of the present invention.

FIG. 3 is a gain analysis circuit 300 in accordance with an exemplary embodiment of the present invention. The effective transconductance $g_m$ equals $1/(2*R_s)$. It should also be noted that $g_m$ is independent of $R_f$ for a matched input.

Figure 4:
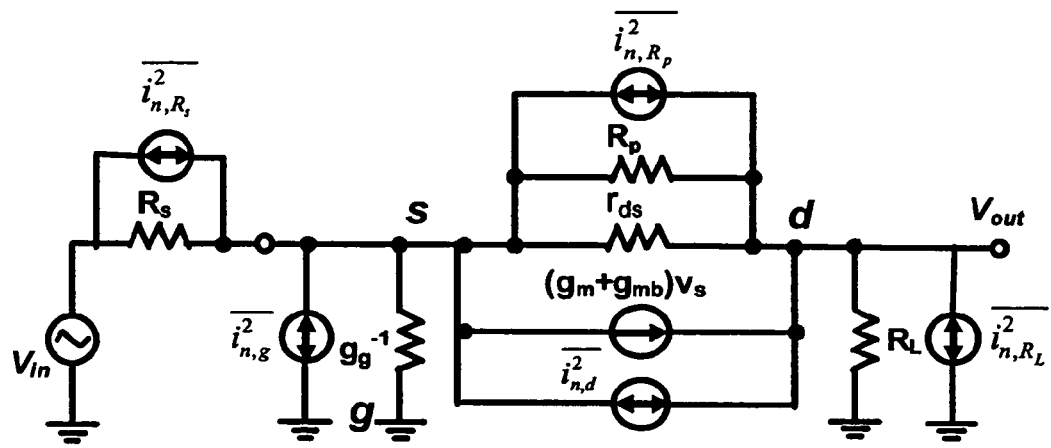
FIG. 4 is a small-signal equivalent circuit of a common gate resistive feed-through LNA in accordance with an exemplary embodiment of the present invention.

FIG. 4 is a small-signal equivalent circuit 400 of a common gate resistive feed-through LNA in accordance with an exemplary embodiment of the present invention. In addition to the major noise sources (represented as $i_n$ current sources), $g_m$ is the transistor transconductance, $g_{mb}$ is the backgate transconductance, $g_g$ is the real part of the gate admittance, $\overline{i_{n,d}^2}$ is the transistor channel thermal noise source, and $\overline{i_{n,g}^2}$ is the induced gate noise source. At low frequency, where $\overline{i_{n,g}^2}$ and $g_g$ can be neglected, the feedthrough resistor $R_f$ (which is formed by an external parallel resistance $R_p$ in parallel with the drain-to-source resistance $r_{ds}$) creates a positive feedback loop around the amplifier to enhance the input impedance. At resonance frequency, the input impedance seen looking into the source of $M_1$ can be expressed as:

$$Z_{in} = \frac{R_f + R_L}{1 + g_m R_f (1+\chi)} \quad (1)$$

where $g_m$ is the transistor transconductance and $\chi$ is the ratio of the transistor backgate transconductance $g_{mb}$ to $g_m$. If the input is matched, the effective transconductance of the common gate resistive feed-through stage is given by:

$$G_{m,CGRF} = \frac{1}{2R_s} \quad (2)$$

which indicates that to the first order at the input matching condition, the gain of the common gate resistive feed-through stage is independent of $R_f$ and $g_m$.

Assuming a matched input and $R_s \ll R_L$, the output noise power generated by the thermal noise of $R_p$ and $R_L$ is negligible compared to that generated by the transistor channel thermal noise, in which case the noise factor can be approximately expressed as:

$$F_{CGRF} \approx 1 + \frac{\gamma}{\alpha}\left(\frac{1}{1+\chi}\right)^2 \frac{1}{g_m R_s} \quad (3)$$

where $\alpha$ is the ratio of $g_m$ to the channel conductance at zero drain-to-source voltage, $g_{d0}$.

Based on the simplifying assumptions that gate noise and $g_g$ may be ignored, the noise of the common gate resistive feed-through amplifier approaches 0 dB by increasing $g_m$, providing a direct way to trade between power and noise while keeping the input matched. However, at high frequencies, additional effects need to be considered, such as that the coupling between channel and gate is due to a distributed RC network, reflected in the real part of the gate admittance, $g_g$. In the pinch-off region, $g_g$ is related to operation frequency $\omega_0$, gate-source capacitance, $C_{gs}$, and $g_{d0}$ through:

$$g_g = \frac{C_{gs}^2 \omega_0^2}{5 g_{d0}} \quad (4)$$

This conductance has a thermal noise, $\overline{i_{n,g}^2}$, associated with it, which is called induced gate noise. The power spectral density of $\overline{i_{n,g}^2}$ is given by:

$$\frac{\overline{i_{n,g}^2}}{\Delta f} = 4kT\delta g_g \quad (5)$$

where $\delta$ is the gate noise coefficient, and $\overline{i_{n,d}^2}$ and $\overline{i_{n,g}^2}$ are partially correlated with a complex correlation coefficient c given by:

$$c = \frac{\overline{i_{n,g} i_{n,d}^*}}{\sqrt{\overline{i_{n,g}^2} \overline{i_{n,d}^2}}} \quad (6)$$

Taking $g_g$ into account, the input impedance of the common gate resistive feed-through stage is revised as:

$$Z_{in} = \left( \frac{1 + g_m R_f (1 + \chi)}{R_f + R_L} + \eta(\omega_0) g_m \right)^{-1} \quad (7)$$

where $\eta(\omega_0)$ is defined as the ratio between $g_g$ and $g_m$:

$$\eta(\omega_0) \equiv \frac{g_g}{g_m} \approx \frac{\alpha}{5} \left( \frac{\omega_0}{\omega_T} \right)^2 \quad (8)$$

If input is perfectly matched to $R_S$, the effective transconductance of the common gate resistive feed-through stage is given by:

$$G_{m,CGRF} = \frac{1}{2R_s} [1 - g_m R_s \eta(\omega_0)] \quad (9)$$

which indicates that a large $g_m$ and high frequency can degrade the gain. This is because the increase of $g_m$ results in a larger $g_g$ causing more signal loss through the gate.

If a matched input is provided and $R_s \ll R_L$, the following expression defines the value of F:

$$F_{CGRF} \approx \qquad (10)$$
$$1 + \frac{\gamma}{\alpha} \left( \frac{1}{1+\chi} \right)^2 \left( \frac{1}{g_m R_s} + \eta^2(\omega_0) g_m R_s + 2\eta(\omega_0) \right) + \delta \eta(\omega_0) g_m R_s$$

where the second term represents the contribution of channel thermal noise and the third term represents the contribution of induced gate noise. At low frequencies, $\eta(\omega_0) \to 0$, and equation (10) reduces to equation (3).

An optimum $g_m$ exists for minimum noise figure, i.e., $$g_{m,CGRF,opt} = \frac{1}{R_s} \left( \frac{\delta \alpha}{\gamma} (1+\chi)^2 \eta(\omega_0) + \eta^2(\omega_0) \right)^{-\frac{1}{2}} \quad (11)$$

And the corresponding minimum F is approximately given by:

$$F_{CGRF,min} \approx 1 + \gamma \left( \frac{1}{1+\chi} \sqrt{\frac{4\delta}{5\gamma\alpha}} \left( \frac{\omega_0}{\omega_T} \right) + \frac{1}{\alpha(1+\chi)} \frac{2}{5} \left( \frac{\omega_0}{\omega_T} \right)^2 \right) \quad (12)$$

Since $R^f$ results in positive feedback in the common gate resistive feed-through stage, stability needs to be addressed. Considering the input transistor with feed-through resistor as a two-port network, $Z_S$ and $Z_L$ are the load impedance at the two ports, source and drain, respectively. It is a sufficient condition to prevent oscillation that the real part of both impedances seen looking into the ports, $Z_{in}$ and $Z_{out}$, are positive. $\text{Re}[Z_{in}]$ and $\text{Re}[Z_{out}]$ can be expressed as $$\text{Re}[Z_{in}] = \frac{R_f + \text{Re}[Z_L]}{1 + g_m R_f (1 + \chi)} \quad (13)$$

$$\text{Re}[Z_{out}] = R_f + [g_m R_f (1 + \chi) + 1] \text{Re}[Z_S] \quad (14)$$

where $R_f = R_p \| r_{ds}$, and equations (13) and (14) indicate that as long as $\text{Re}[Z_L]$ and $\text{Re}[Z_S]$ are positive, stability of the common gate resistive feed-through stage is provided.

Figure 5:
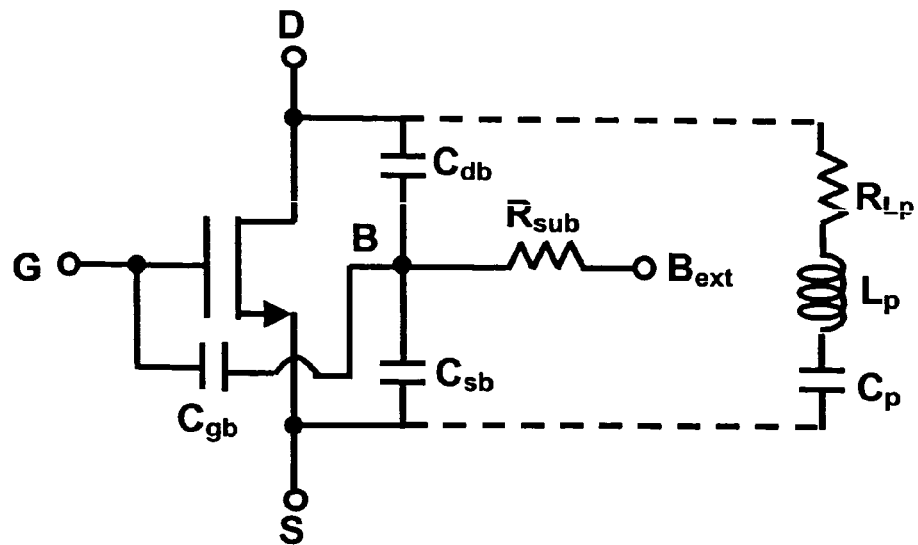
FIG. 5 is a substrate network model for a MOS transistor in accordance with an exemplary embodiment of the present invention.

FIG. 5 is a substrate network model 500 for a MOS transistor in accordance with an exemplary embodiment of the present invention. Capacitive coupling between the drain and source through this network adversely affects stability and the noise figure. A shunt inductor $L_p$ in series with a large bypass capacitor $C_p$ resonates the equivalent capacitance between drain and source so that the substrate effects are reduced. The series resistance of $L_p$ can be converted to an equivalent parallel resistance, which affects the performance of the LNA as a feed-through resistor. In this case, the feed-through resistance can be expressed as $$R_f = Q \omega_0 L_p \| r_{ds} \quad (15)$$

where $R_{L_p}$ is the series resistance of $L_p$.

Figure 6:
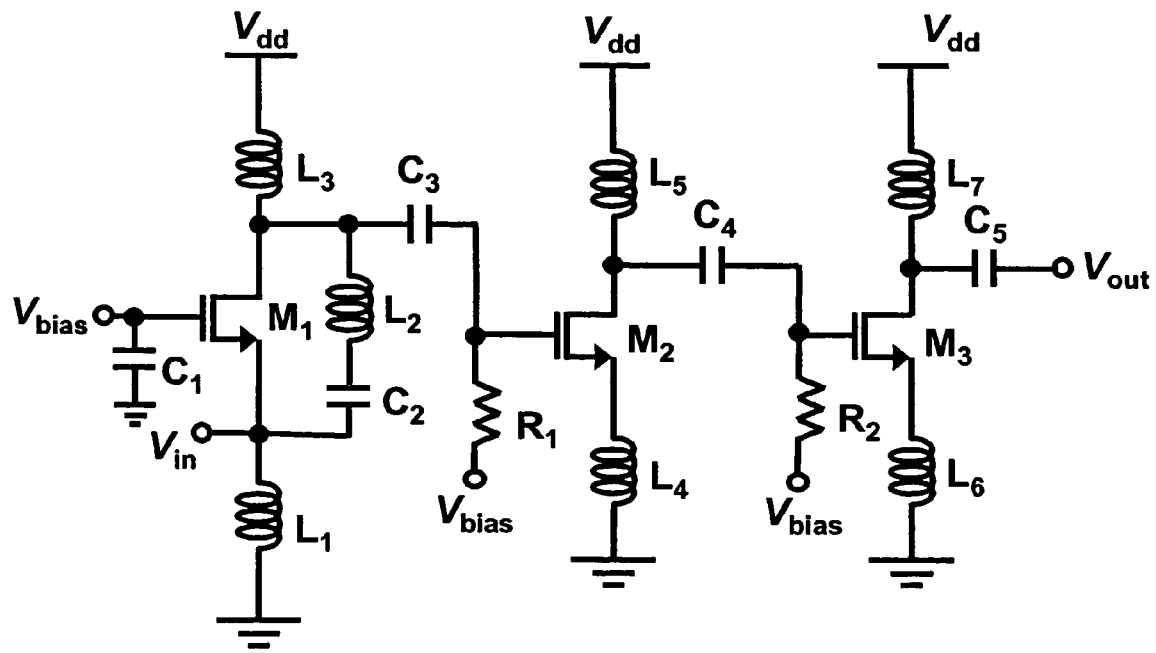
FIG. 6 is a 24-GHz CMOS LNA in accordance with an exemplary embodiment of the present invention.

FIG. 6 is a 24-GHz CMOS LNA 600 in accordance with an exemplary embodiment of the present invention. An experimental embodiment of LNA 600 was also constructed, and test results from tests performed on that experimental embodiment are discussed herein in greater detail.

LNA 600 includes three stages. The first stage employs a common-gate with resistive feed-through topology, where shunt inductor $L_2$ resonates the capacitive coupling between the drain and the source of $M_1$, while its parasitic resistance $R_{L2}$ introduces a feed-through resistance described by equation (15). A large capacitor $C_2$ isolates the dc level of the source and the drain. The second and third stages are both common-source with inductive degeneration amplifiers, which are used to enhance the overall gain.

The peak $f_T$ of the 0.18-μm CMOS device used at 1.5 V bias is about 60 GHz. To achieve the minimum noise figure at 24 GHz, the optimum $g_{m1}$ is estimated to be about 80 mS in accordance with equation (11). To reduce the power consumption, $g_{m1}$ is set to 40 mS. $(V_{gs}-V_t)$ is also lowered by a factor of two from its value of peak $f_T$, which is a power efficient way for reducing current consumption by more than 50%, while reducing $f_T$ by about 10% only. Finally $M_1$ is biased at 8 mA with 54 GHz $f_T$. The second and third stages consume 4 mA each.

Since the feed-through resistor is replaced by an inductor in the first stage, the stability of the amplifier needs to be reexamined. Computer circuit simulations show that the first stage is stable up to 43 GHz. Above 43 GHz, the stability factor of the stage, $K_f$, is less than one. However, the input impedance of the second stage is located in the stable region with sufficient margin for stable operation in the frequency range of interest.

Figures 7, 8:
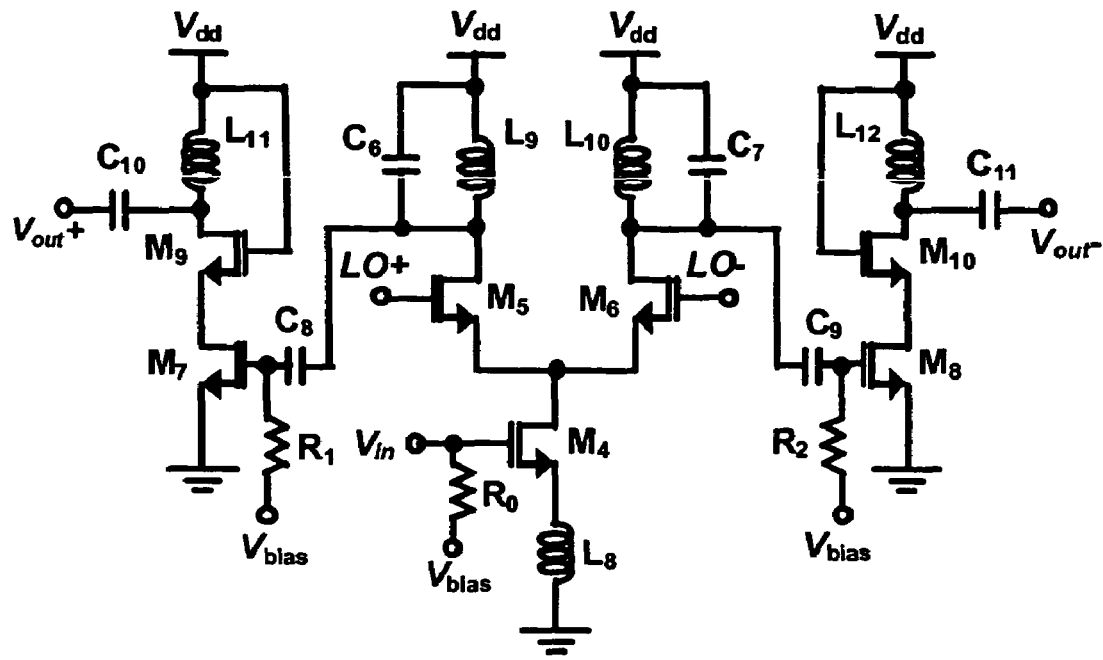
FIG. 7 is a diagram of a mixer in accordance with an exemplary embodiment of the present invention.
FIG. 8 is a table presenting measurements from experimental embodiments of an LNA and a mixer.

FIG. 7 is a diagram of a mixer 700 in accordance with an exemplary embodiment of the present invention. A conventional single-balanced Gilbert cell is used, and the RF input is applied at the gate of $M_4$ which is used as a transconductance amplifier. The linearity of this transconductance amplifier is improved by using source degeneration inductor $L_g$, which also adjusts the input impedance seen looking into the gate of $M_4$ in order to improve the power matching at the LNA-mixer interface. $M_4$ is biased at 4 mA dc current.

The chopping function of mixer 700 is accomplished by the $M_2 \sim M_3$ mixing cell and a 1.6 V peak-to-peak differential LO signal is applied. Cascode amplifiers following the differential mixing cell are used to drive the 50-Ω loads. The output-match is accomplished by the LC impedance transforming network.

FIG. 8 is a table 800 presenting measurements from experimental embodiments of LNA 600 and mixer 700. The circuits were designed and fabricated using 0.18-μm CMOS transistors. The process used to fabricate the experimental embodiments used six metal layers with two top layers of 1-μm thick copper. The inductors $L_4$ and $L_6$ of LNA 600 and $L_8$ of mixer 700 were implemented as slab inductors, and the remaining inductors were implemented as spirals. Shielded pads were employed at both transmission frequency and intermediate frequency ports. Grounded metal underneath the pads prevented loss of the signal power and noise generation associated with substrate resistance.

Ground rings were placed around each transistor at a minimum distance to reduce the substrate loss. Separated $V_{dd}$ pads were assigned to LNA 600, mixer 700, and bias circuits. Large on-chip bypass capacitors were placed between each $V_{dd}$ and ground. The size of the chip was 0.8×0.9 mm including a large area occupied by the wide ground rings and pads. The size of the core cell was only 0.4×0.5 mm.

The image rejection of the front-end was −31 dB. This performance was achieved via the large intermediate frequency and the multi-stage nature of LNA 600. The overall current consumption of the front-end was 43 mA, out of which the output buffers consumed 23 mA. The experimental embodiments of LNA 600 and mixer 700 drew 16 mA and 4 mA, respectively, from a 1.5-V supply voltage.

Figure 9:
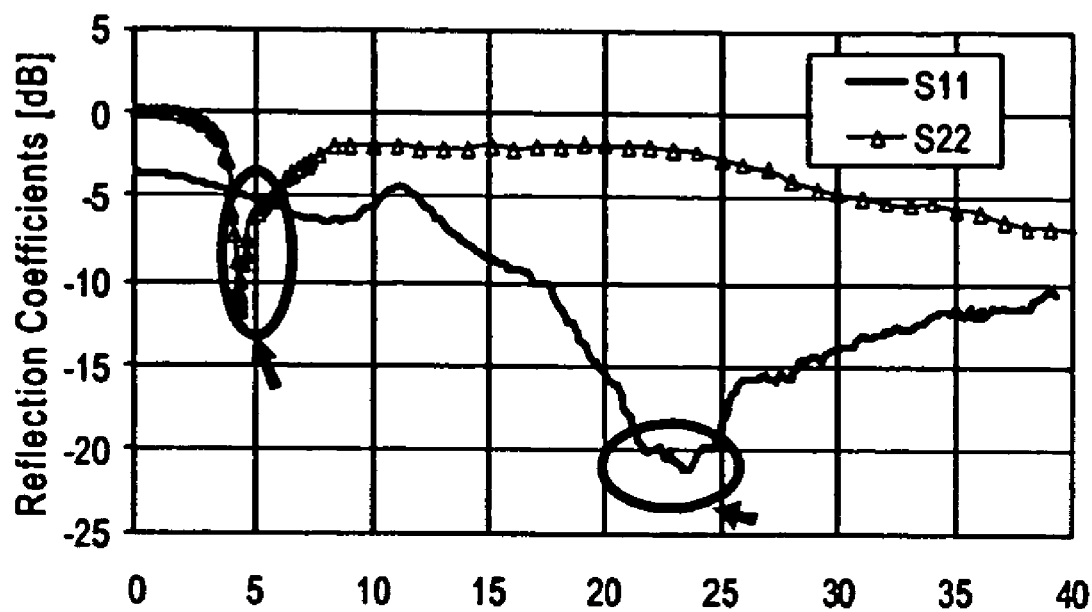
FIG. 9 shows measured input and output reflection coefficients, $S_{11}$ and $S_{22}$, for the experimental embodiments of an LNA and a mixer.

FIG. 9 shows the measured input and output reflection coefficients, $S_{11}$ and $S_{22}$, for the experimental embodiments of LNA 600 and mixer 700. As shown by these measurements, the radio frequency input and the intermediate frequency output are well matched at the respective frequencies.

Figure 10:
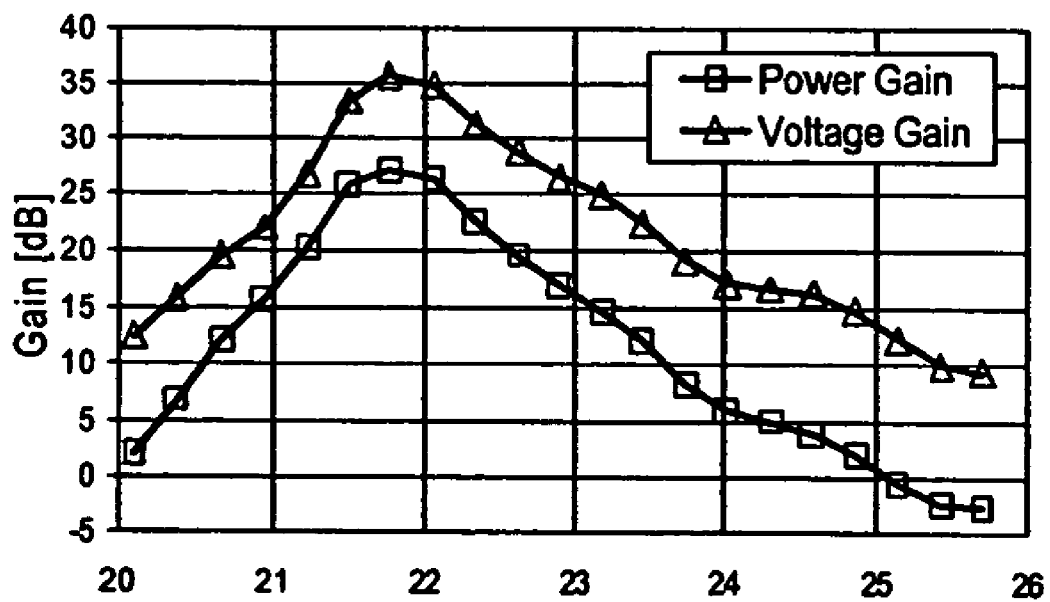
FIG. 10 shows the measured power gain and extracted voltage gain for the experimental embodiments of an LNA and a mixer with a 16.9-GHz local oscillator frequency.

FIG. 10 shows the measured power gain and extracted voltage gain for the experimental embodiments of LNA 600 and mixer 700 with a 16.9-GHz local oscillator frequency. The measurement shows that a 27.5 dB maximum power gain appears for a transmission frequency of 21.8 GHz and an intermediate frequency of 4.9 GHz. The frequency offset from the 24 GHz is likely due to inaccurate modeling of the MOS transistor and the planar inductor at high frequencies. The experimental embodiment of LNA 600 achieved a 15-dB power gain. The experimental embodiment of mixer 700 further enhanced the signal power by 13 dB. Because of the imperfect conjugate-matching at the LNA-mixer interface, the overall power gain of the front-end was slightly lower than the sum of the individual power gain of the two blocks.

Figure 11:
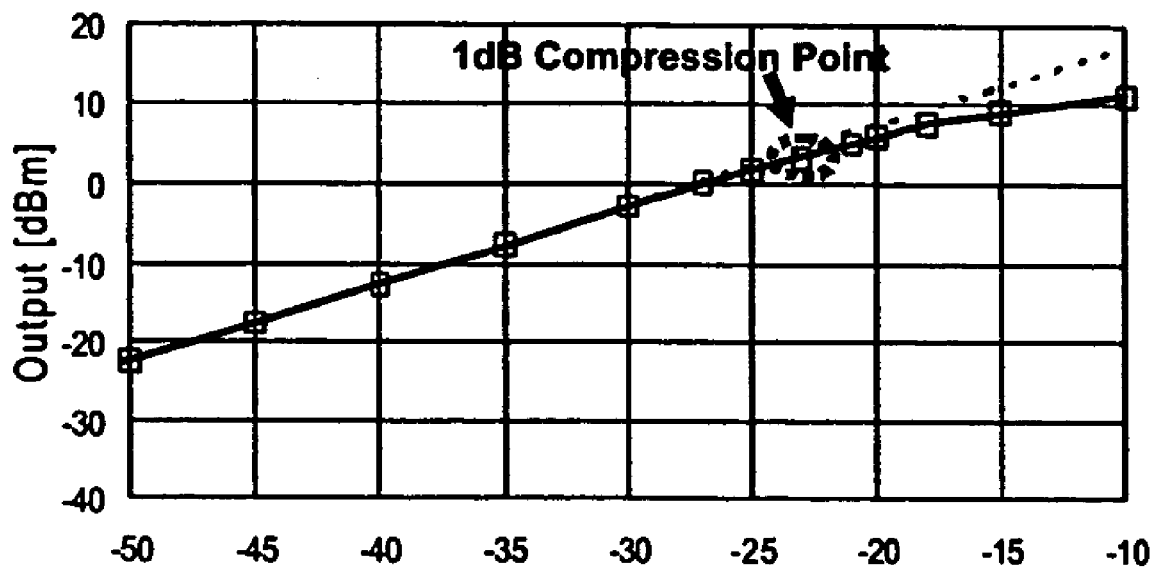
FIG. 11 shows the measured large-signal nonlinearity for the experimental embodiments of an LNA and a mixer.

FIG. 11 shows the measured large-signal nonlinearity for the experimental embodiments of LNA 600 and mixer 700. The input referred 1 dB compression points appears at −23 dBm.

Figure 12:
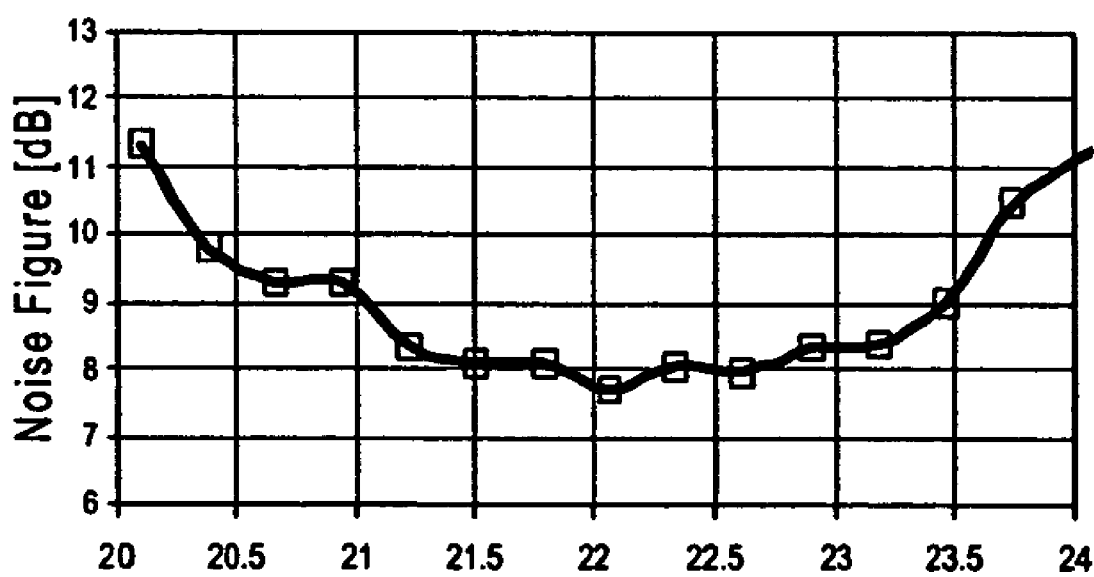
FIG. 12 shows the measured noise figure for the experimental embodiments of an LNA and a mixer.

FIG. 12 shows the measured noise figure for the experimental embodiments of LNA 600 and mixer 700. A minimum noise figure of 7.7 dB was achieved for the combined LNA 600 and mixer 700 at 22.08 GHz. The individual noise figures of LNA 600 and mixer 700 were 6 dB and 17.5 dB, respectively. The noise figure of the first common gate resistive feed-through stage was extracted to be 4.8 dB. Applying equation (3) predicts the $\overline{i_{n,d}^2}$ only noise figure of the first stage to be 3.3 dB. Applying equation (10) adjusts the prediction of the noise figure to be 4.1 dB by taking $g_g$ and $\overline{i_{n,g}^2}$ into account, and the remaining amount of 0.7 dB is due to the thermal noise of the parasitic resistance and substrate noise.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. A radio-frequency amplifier comprising:
    a transistor having an input terminal, an output terminal and a control terminal;
    a series-connected feed-through resistance and feed-through capacitance connected in parallel with the input terminal and the output terminal of the transistor;
    a load impedance connected to the output terminal of the transistor; and
    wherein the control terminal of the transistor is coupled to common voltage, and the radio-frequency amplifier is driven by a signal source in series with an impedance $R_s$ coupled between the input terminal and common voltage, wherein a transconductance $g_m$ of the transistor is larger than $1/R_s$.

2. The radio-frequency amplifier of claim 1 further comprising a tank circuit connected between a voltage source $V_{dd}$ and the output terminal of the transistor.

3. The radio-frequency amplifier of claim 1 wherein the feed-through resistance is formed by a resistor $R_p$ in parallel with a transistor drain-source small-signal resistance $r_{ds}$.

4. The radio-frequency amplifier of claim 1 wherein the feed-through resistance further comprises a resonant capacitive-inductive circuit having an effective resistance at an operating frequency.

5. The radio-frequency amplifier of claim 1 wherein the transistor further comprises transconductance means for reducing noise.

6. The radio-frequency amplifier of claim 1 wherein the load impedance comprises a parallel combination of a resistance, a capacitance, and an inductance.

7. The radio-frequency amplifier of claim 1 wherein the radio frequency amplifier is coupled to a radio-frequency receiver.

8. A high-frequency CMOS low noise amplifier comprising:
    a first stage including a common-gate amplifier having a source and a drain with a feed-through resistance coupled between the source and the drain, wherein the feed-through resistance further comprises a resonant capacitive-inductive circuit having an effective resistance at an operating frequency;
    a second stage coupled to the first stage including a common-source amplifier with inductive degeneration; and
    a third stage coupled to the second stage including a common-source amplifier with inductive degeneration.

9. The high-frequency CMOS low noise amplifier of claim 8 wherein the feed-through resistance is formed by a resistance in parallel with a transistor drain-source resistance.

10. The high-frequency CMOS low noise amplifier of claim 8 driven by a signal source with output impedance $R_s$, wherein a transconductance $g_m$ of the input transistor is larger than $1/R_s$, and a series-connected resistor $R_f$ and capacitor $C_f$ is connected between the input terminal and the output terminal of the input transistor, so that the real part of an input impedance of the high-frequency CMOS low noise amplifier is increased.

11. The high frequency CMOS low noise amplifier of claim 8 wherein the common-gate amplifier comprises transconductance means for reducing noise.

12. The high frequency CMOS low noise amplifier of claim 8 wherein the high-frequency CMOS low noise amplifier is coupled to a radio-frequency receiver.

13. A radio-frequency amplifier comprising:
a transistor having an input terminal, an output terminal and a control terminal;
a series-connected resonant capacitive-inductive circuit having an effective resistance at an operating frequency connected in parallel with the input terminal and the output terminal of the transistor;
a load impedance connected to the output terminal of the transistor; and
wherein the control terminal of the transistor is coupled to common voltage, and wherein the radio-frequency amplifier is driven by a signal source in series with an impedance $R_s$ coupled between the input terminal and common voltage, wherein a transconductance $g_m$ of the transistor is larger than $1/R_s$.

14. The radio-frequency amplifier of claim 13 wherein the load impedance comprises a tank circuit.

15. The radio-frequency amplifier of claim 13 comprising a feed-through resistance formed by a resistor $R_p$ in parallel with a transistor drain-source small-signal resistance $r_{ds}$.

16. The radio-frequency amplifier of claim 13 wherein the transistor further comprises transconductance means for reducing noise.

17. The radio-frequency amplifier of claim 13 wherein the load impedance comprises a parallel combination of a resistance, a capacitance, and an inductance.

18. The radio-frequency amplifier of claim 13 wherein the radio frequency amplifier is coupled to a radio-frequency receiver.

19. A low noise amplifier comprising:
a first stage including a common-gate amplifier having a source and a drain with a feed-through resistance coupled between the source and the drain;
a second stage coupled to the first stage including a common-source amplifier with inductive degeneration;
a third stage coupled to the second stage including a common-source amplifier with inductive degeneration; and
wherein the low noise amplifier is driven by a signal source with output impedance $R_s$, wherein a transconductance $g_m$ of the input transistor is larger than $1/R_s$.

20. The low noise amplifier of claim 19 wherein the feed-through resistance is formed by a resistance in parallel with a transistor drain-source resistance.

21. The low noise amplifier of claim 19 wherein the feed-through resistance further comprises a resonant capacitive-inductive circuit having an effective resistance at an operating frequency.

22. The low noise amplifier of claim 19 wherein the common-gate amplifier comprises transconductance means for reducing noise.

23. The low noise amplifier of claim 19 wherein the high-frequency CMOS low noise amplifier is coupled to a radio-frequency receiver.

24. A radio-frequency amplifier comprising:
a transistor having an input terminal, an output terminal and a control terminal;
a series-connected resonant capacitive-inductive circuit having an effective resistance at an operating frequency connected in parallel with the input terminal and the output terminal of the transistor;
a load impedance connected to the output terminal of the transistor;
wherein the control terminal of the transistor is coupled to common voltage; and
a feed-through resistance formed by a resistor $R_p$ in parallel with a transistor drain-source small-signal resistance $r_{ds}$.

25. The radio-frequency amplifier of claim 24 driven by a signal source in series with an impedance $R_s$ coupled between the input terminal and common voltage, wherein a transconductance $g_m$ of the transistor is larger than $1/R_s$.

26. The radio-frequency amplifier of claim 24 wherein the load impedance comprises a tank circuit.

27. The radio-frequency amplifier of claim 24 wherein the transistor further comprises transconductance means for reducing noise.

28. The radio-frequency amplifier of claim 24 wherein the load impedance comprises a parallel combination of a resistance, a capacitance, and an inductance.

29. The radio-frequency amplifier of claim 24 wherein the radio frequency amplifier is coupled to a radio-frequency receiver.

30. A radio-frequency amplifier comprising:
a transistor having an input terminal, an output terminal and a control terminal;
a series-connected resonant capacitive-inductive circuit having an effective resistance at an operating frequency connected in parallel with the input terminal and the output terminal of the transistor;
a load impedance connected to the output terminal of the transistor;
wherein the control terminal of the transistor is coupled to common voltage; and
wherein the load impedance comprises a parallel combination of a resistance, a capacitance, and an inductance.

31. The radio-frequency amplifier of claim 30 driven by a signal source in series with an impedance $R_s$ coupled between the input terminal and common voltage, wherein a transconductance $g_m$ of the transistor is larger than $1/R_s$.

32. The radio-frequency amplifier of claim 30 wherein the load impedance comprises a tank circuit.

33. The radio-frequency amplifier of claim 30 comprising a feed-through resistance formed by a resistor $R_p$ in parallel with a transistor drain-source small-signal resistance $r_{ds}$.

34. The radio-frequency amplifier of claim 30 wherein the transistor further comprises transconductance means for reducing noise.

35. The radio-frequency amplifier of claim 30 wherein the radio frequency amplifier is coupled to a radio-frequency receiver.

* * * * *